US006380810B1

United States Patent
Sutton

(10) Patent No.: US 6,380,810 B1
(45) Date of Patent: Apr. 30, 2002

(54) REDUCED LOCK TIME FOR A PHASE LOCKED LOOP

(75) Inventor: Brian P. Sutton, West Linn, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/645,212

(22) Filed: Aug. 24, 2000

(51) Int. Cl.$^7$ .............................................. H03L 7/093
(52) U.S. Cl. ...................... 331/17; 331/177 R; 331/175; 331/25
(58) Field of Search ...................... 331/10, 17, 177 R, 331/25, DIG. 2

(56) References Cited

U.S. PATENT DOCUMENTS 4,562,410 A * 12/1985 O'Rourke ................... 331/1 A
5,546,053 A * 8/1996 Ichimaru ..................... 331/11

* cited by examiner

Primary Examiner—Arnold Kinkead
(74) Attorney, Agent, or Firm—Francis I. Gray

(57) ABSTRACT

A reduced lock time phase locked loop has a speed up circuit with an operational amplifier to amplify a differential voltage across a filter resistor of an RC noise filter, the RC noise filter coupling a coarse tune voltage to a VCO. The amplifed differential voltage is applied to the bases of a pair of opposite polarity transistors, the emitters of the transistors being coupled to a filter capacitor in the RC noise filter for rapid charging/discharging. Alternatively the amplified differential voltage is applied to a pair of parallel, opposite polarity diodes coupled to the filter capacitor for rapid charging/discharging.

3 Claims, 2 Drawing Sheets

REDUCED LOCK TIME FOR A PHASE LOCKED LOOP

BACKGROUND OF THE INVENTION

The present invention relates to electronic timing generation, and more particularly to a technique for reducing lock time of a phase locked loop (PLL).

In electronic systems that use phase locked loops (PLL) for generating a clock or other synchronized timing signal, the time required for the PLL to achieve lock is usually important to its operation. Therefore most PLLs are designed to meet a maximum allowable lock time specification, also known as switching speed. The time for a PLL to achieve lock is dependent upon a number of factors, such as the PLL's loop bandwidth, damping factor, frequency step size, etc. Since some of these parameters are constrained by other system requirements, system performance tradeoffs are generally necessary. Depending upon the system's performance requirements, a single PLL may not be able to simultaneously meet all the specifications and more complex, costly designs using multiple PLLs may be required.

FIG. 1 shows alternative prior art phase lock loops. The conventional PLL has a reference signal source, or oscillator, the output of which is input to a phase detector. Also input to the phase detector is the output of a voltage controlled oscillator (VCO) via a frequency divider. The difference in frequency between the reference signal source and the VCO output is provided by the phase detector to a loop filter. The output from the loop filter is a control signal applied to the VCO to adjust the VCO output frequency.

This basic PLL configuration works well for applications that tune over narrow frequency ranges and/or do not have demanding low phase noise requirements. When the PLL must tune over a wide frequency range and the PLL's phase noise performance is also critical, the circuit configuration shown in FIG. 1 is often used. The VCO's fine and coarse tune ports may be two physically separate terminals on the VCO, or they may be implemented using a resistive voltage divider network ahead of the VCO with only a single tune port. The fine tune port has a low tuning sensitivity, necessary to achieve good phase noise and spurious performance, and is controlled by the behavior of the feedback circuit of the closed-loop control system. It is responsible for maintaining the PLL in phase-lock. Since the fine tune port has low tuning sensitivity, the capture and hold-in range is small, and hence the VCO must be tuned close to the desired operating frequency using the VCO's coarse tune port. In a wide tuning PLL the tuning sensitivity of the coarse tuning port is high. The coarse tune voltage is typically derived from a digital to analog converter and is usually filtered by a very long time-constant RC filter to prevent noise injection into the PLL. A distinct limitation of this architecture is that, whenever it is desired to lock the PLL to a new frequency or when the PLL is first turned on, the large filter capacitor must be charged sufficiently close to the proper value for the fine tune port to capture control and achieve phase lock. Since the rate of change of voltage across the filter capacitor diminishes as the capacitor charges/discharges towards its final value, the time to achieve phase lock may be excessively long. In some instances the lock time may be improved by adding speed-up circuitry, shown in dotted lines in FIG. 1. An electronic switch may be used to reduce the RC time constant while the capacitor is charging. The switch then opens to increase the filtering after the PLL has locked. One disadvantage of this approach is that low resistance electronic switches with high current carrying capacity, good OFF isolation and small size are expensive. Also charge injection when the switch is turned OFF may momentarily upset the loop, and additional driver circuitry may be required to control the switch. In FIG. 2 the electronic switch is replaced with diodes to shunt a low value resistor across the filter when the capacitor needs to be charged or discharged. This circuit works well for large changes in coarse tune voltage, but eventually when the voltage differential between the output of the DAC and the capacitor is less than a diode drop, approximately 0.65 volts, the diode becomes open circuited and the shunt resistor is rendered ineffective. This circuit results in significant lock times, especially when the coarse tune sensitivity is a couple of hundred MHz per volt and the fine tuning port has a narrow tuning range, which may be only several hundred kHz for good spurious and noise performance. The filter still has to charge with a relatively long time constant until the VCO is tuned within the range to achieve lock.

What is desired is a technique for reducing lock up time of a PLL when other system constraints are inconsistent with achieving fast switching speed.

BRIEF SUMMARY OF THE INVENTION

According the present invention provides a phase locked loop with reduced lock time by having an operational amplifier amplify a differential voltage across a filter resistor of an RC noise filter, the RC noise filter being used to couple a coarse tune voltage to a VCO in the phase locked loop. The amplified differential voltage is coupled to the bases of a pair of opposite polarity transistors to turn ON one of the transistors, which in turn rapidly charges/discharges a filter capacitor of the RC noise filter until the charge on the filter capacitor closely approximates the applied coarse tune voltage. Alternatively the amplified differential voltage may be applied to a pair of parallel, opposite polarity diodes coupled to rapidly charge/discharge the filter capacitor.

The objects, advantages and other novel features of the present invention are apparent from the following detailed description when read in conjunction with the appended claims and attached drawing.

DETAILED DESCRIPTION OF THE INVENTION

Figure 3:
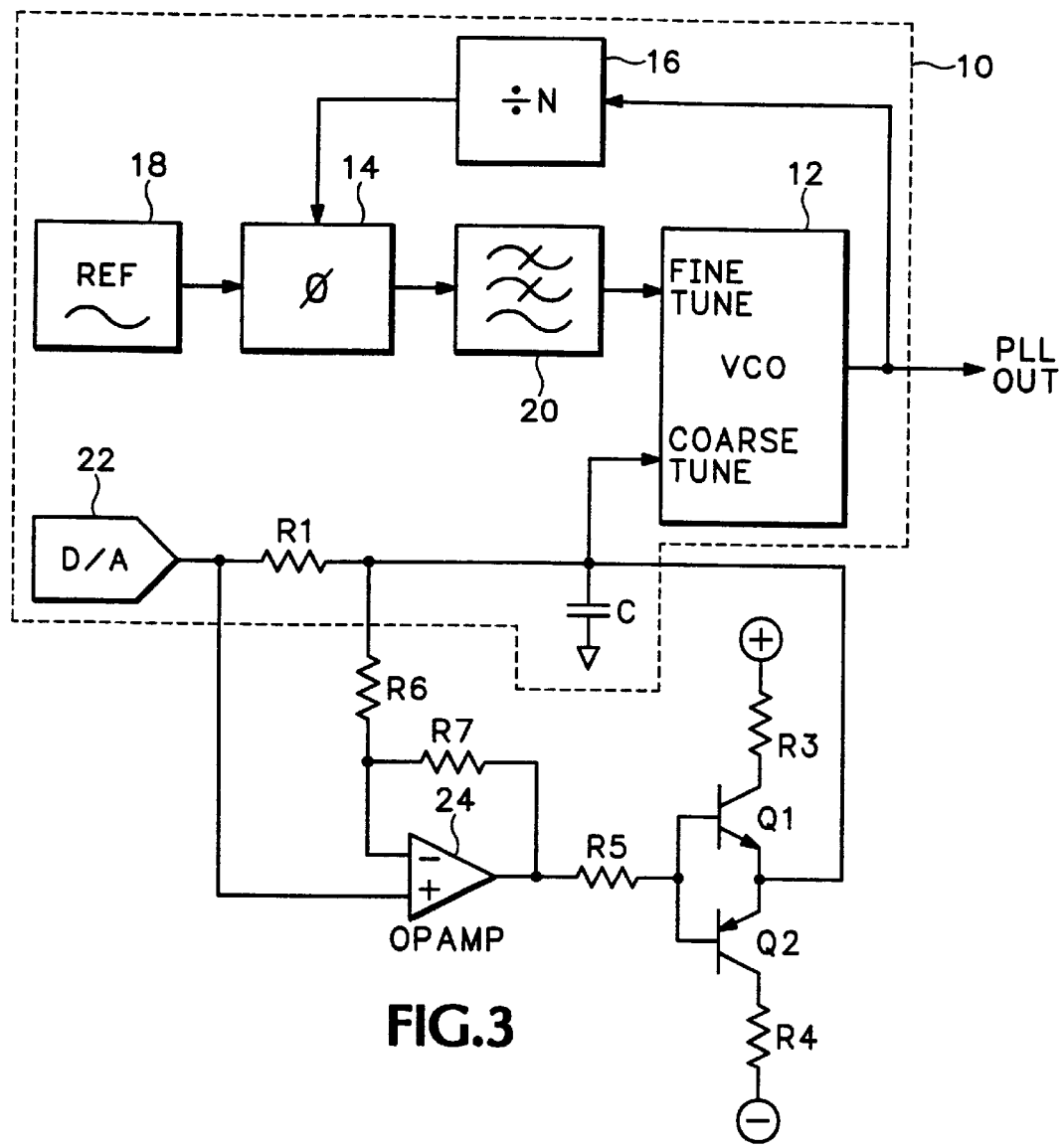
FIG. 3 is a block diagram view of a phase locked loop with reduced lock time according to the present invention.

Referring now to FIG. 3 a standard PLL 10 is shown having a VCO 12 with fine and coarse tune ports, and a phase detector 14 having the output from the VCO fed back via a divider 16 as one input and the output from a reference oscillator 18 as another input to provide a control voltage via a loop filter 20 to the fine tune port of the VCO. A DAC 22 provides a coarse control voltage via an RC noise filter to the coarse tune port of the VCO 12. The voltage drop across the RC filter resistor R1 is input to an operational amplifier 24 having a feedback resistor R7 via resistor R6. The output of the OPAMP 24 is applied via resistor R5 to the common bases of opposite polarity transistors Q1, Q2. The collectors of the transistors are coupled to respective power supplies via resistors R3, R4 and the common emitters are coupled to the coarse tune port of the VCO 12.

In operation when the PLL 10 is in a locked state, the transistors Q1, Q2 are cut off, i.e., open circuited, and the RC noise filter functions as usual. When the PLL frequency is changed, or when the loop is first turned ON, any voltage differential across the filter resistor R1 is sensed and amplified by the OPAMP 24. This causes the output of the OPAMP 24 to turn transistor Q1 ON if the charge on the filter capacitor C needs to be increased, or turns transistor Q2 On if the charge on the filter capacitor need to be decreased. The ON transistor then operates as a saturated switch to rapidly charge or discharge the filter capacitor C until its voltage is nearly identical to the output of the DAC 22. When the voltage of the filter capacitor C is approximately equal to the output of the DAC 22, the OPAMP 24 automatically turns OFF the ON transistor. Resistors R3, R4 serve to limit the filter capacitors charge/discharge currents to safe levels. Since the transistors Q1, Q2 operate in either a cutoff or saturated state, they dissipate very little power. The voltage gain of the OPAMP 24, set by the ratio of resistors R6, R7, may be made large so that the transistors remain ON until the voltage differential across filter resistor R1 is a very small fraction of a diode drop, the forward $V_{be}$ of the transistors. For example if the OPAMP voltage gain is 10, then the transistors assist in speeding up the PLL until the filter capacitor C is charged/discharged to within approximately 0.65/10=0.065 volts.

Figure 1:
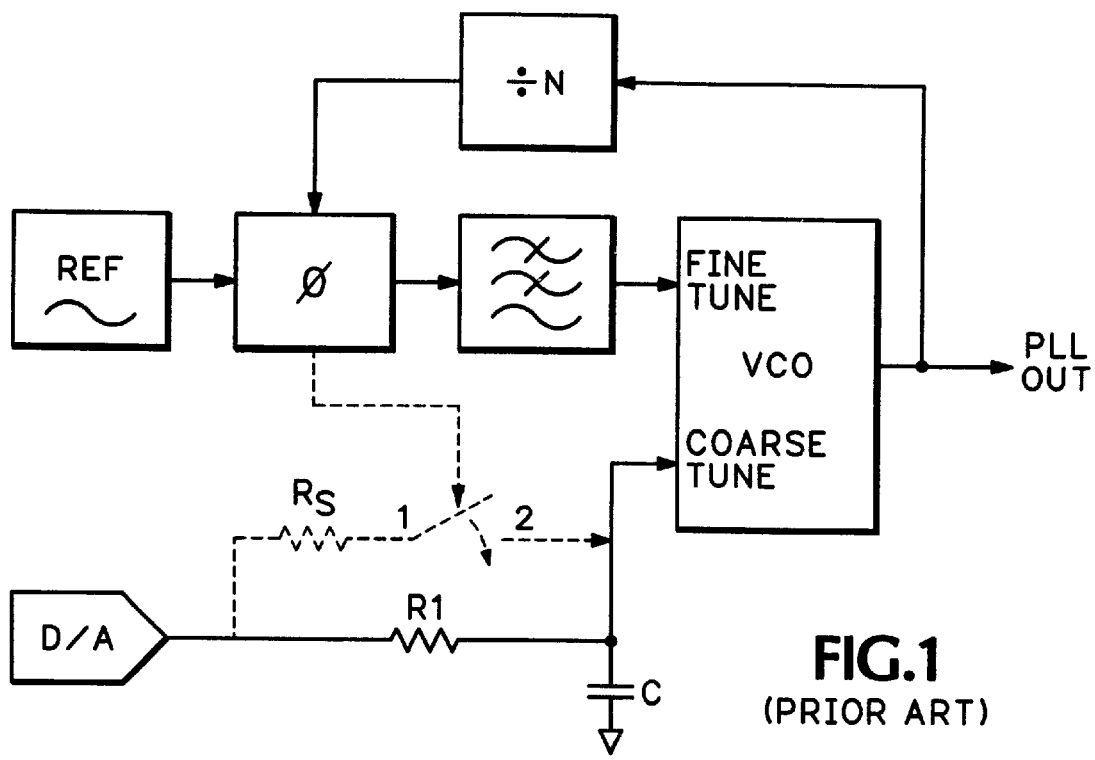
FIGS. 1 and 2 are block diagram views of a phase locked loop having wide tuning range with various prior art techniques for achieving fast lock.
Figure 2:
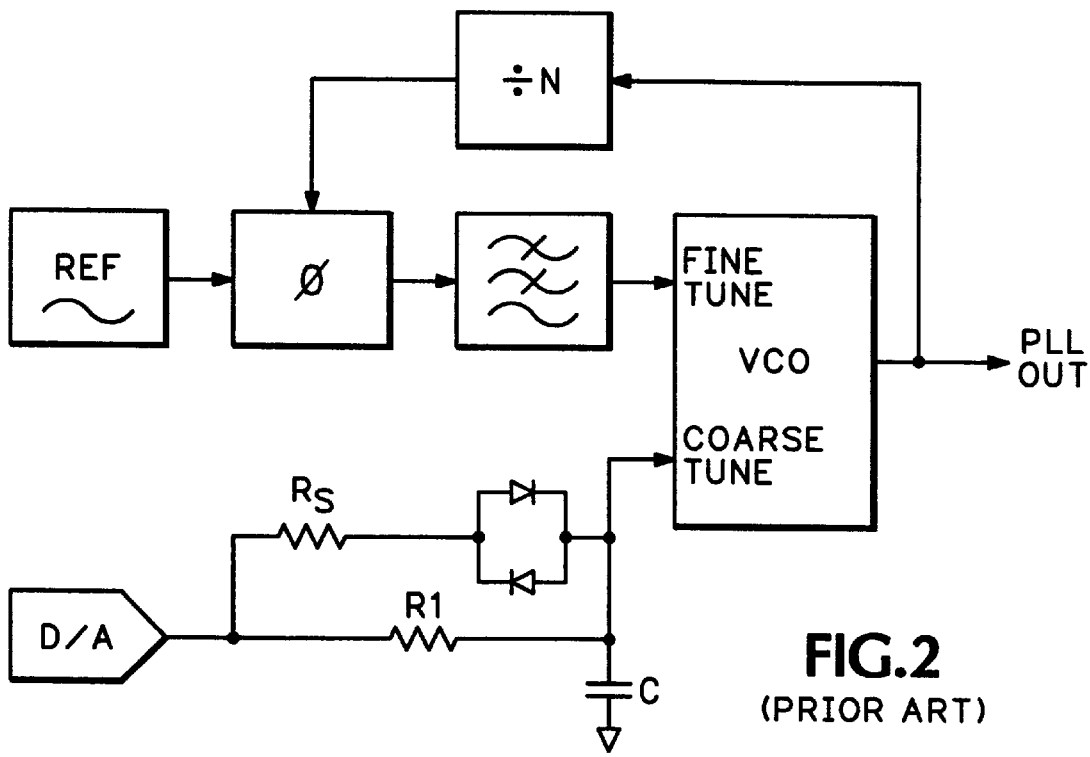

Also since the transistors Q1, Q2 are saturated when conducting, the charge/discharge current may be made quite high, determined by limit resistors R3, R4. The charge/discharge current is no longer dependent upon the magnitude of the voltage differential across the filter resistor R1 as in the prior art. By connecting the limit resistors R3, R4 to high supply voltages, the higher charge/discharge currents may be maintained right up to the point when the ON transistor turns OFF. The transistors are never ON simultaneously. When both transistors are turned OFF, the speedup circuit is effectively removed from the coarse tune port and it does not inject noise into the PLL 10. Because the circuit is effective in rapidly charging/discharging large values of filter capacitance, large RC time constants may be used to achieve low noise PLLs without paying a penalty in lock time. This circuit also operates without additional drive circuitry from the PLL's lock detector. In one PLL circuit the result of adding this speedup circuitry resulted in reducing the lock time from 18 mS for the diode style speedup circuit of FIG. 2 to approximately 1 mS or less. No degradation in the PLL's phase noise performance was observed.

Figure 4:
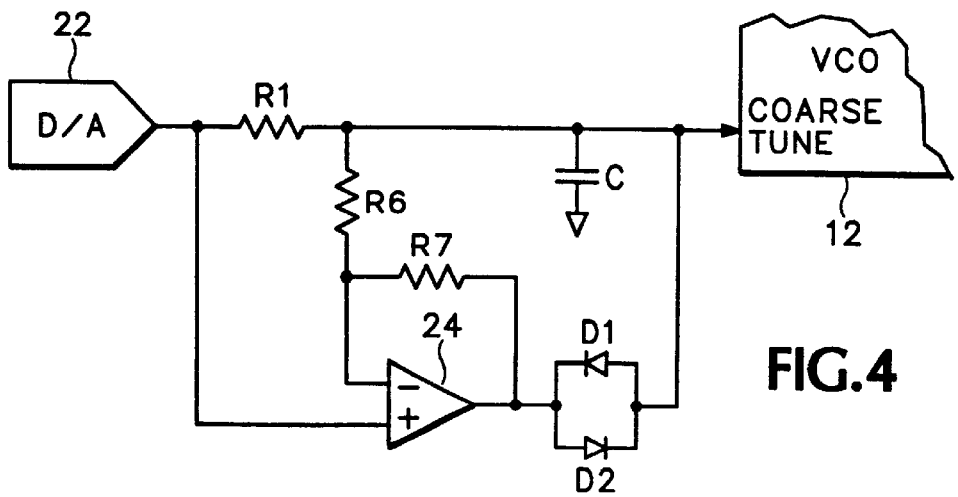
FIG. 4 is a block diagram view of an alternative arrangement for the speedup circuit of FIG. 3 according to the present invention.

In FIG. 4 is shown an alternative embodiment of the speedup circuit with the resistors R3–R5 and transistors Q1, Q2 being replaced with opposing diodes D1, D2 in parallel between the output of the OPAMP 24 and the input to the VCO 12.

This speedup circuit may be used in any application other than PLLs that requires a low noise, well filtered DC control voltage which may need to be quickly reset to a different value. Such applications include voltage controlled attenuators and filtered reference voltages for agile voltage regulators and power supplies.

Thus the present invention provides a reduced lock time for phase locked loops by amplifying the voltage across a noise filter resistor coupled to the coarse tune port of a VCO to turn ON one of two opposite polarity transistors for rapidly charging/discharging the noise filter capacitor.

What is claimed is:

1. A speedup circuit for charging/discharging a filter capacitor in an RC filter comprising:
    an operational amplifier for amplifying a differential voltage across a resistor in the RC filter to produce an amplified differential voltage; and
    a pair of opposite polarity transistors having their bases coupled together to receive the amplified differential voltage as an input and having their emitters coupled together to provide a large current output coupled to rapidly charge/discharge the filter capacitor.

2. An improved phase locked loop of the type having a VCO with a fine tune voltage input and a coarse tune voltage input, the coarse tune voltage input being provided via an RC noise filter having a filter resistor and a filter capacitor, wherein the improvement comprises:
    an operational amplifier for amplifying a differential voltage across the filter resistor to produce an amplified differential voltage; and
    a pair of opposite polarity transistors having their bases coupled together to receive the amplified different voltage as an input and having their emitters coupled together to provide a large current output coupled to rapidly charge/discharge the filter capacitor.

3. A speedup circuit for charging/discharging a filter capacitor in an RC filter comprising:
    means for amplifying a differential voltage across a resistor in the RC filter to produce an amplified differential voltage; and
    a pair of opposite polarity diodes coupled in parallel between the amplifying means and the filter capacitor to receive the amplified differential voltage and provide a large current output to rapidly charge/discharge the filter capacitor.

* * * * *